United States Patent
Huang et al.

(10) Patent No.: US 9,508,839 B2
(45) Date of Patent: Nov. 29, 2016

(54) SHORT-GATE TUNNELING FIELD EFFECT TRANSISTOR HAVING NON-UNIFORMLY DOPED VERTICAL CHANNEL AND FABRICATION METHOD THEREOF

(71) Applicant: Peking University, Beijing (CN)

(72) Inventors: Ru Huang, Beijing (CN); Chunlei Wu, Beijing (CN); Qianqian Huang, Beijing (CN); Chao Wang, Beijing (CN); Jiaxin Wang, Beijing (CN); Yangyuan Wang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/771,627

(22) PCT Filed: Sep. 30, 2013

(86) PCT No.: PCT/CN2013/084718
§ 371 (c)(1),
(2) Date: Aug. 31, 2015

(87) PCT Pub. No.: WO2014/146417
PCT Pub. Date: Sep. 25, 2014

(65) Prior Publication Data
US 2016/0020306 A1  Jan. 21, 2016

(30) Foreign Application Priority Data

Mar. 18, 2013 (CN) .......................... 2013 1 0084972

(51) Int. Cl.
*H01L 29/06* (2006.01)
*H01L 29/08* (2006.01)
(Continued)

(52) U.S. Cl.
CPC ......... *H01L 29/66977* (2013.01); *B82Y 10/00* (2013.01); *H01L 21/266* (2013.01);
(Continued)

(58) Field of Classification Search
CPC .................... H01L 29/7391; H01L 29/66356; H01L 29/66666; H01L 29/7827; H01L 2924/13066; H01L 27/11273; H01L 29/0895; H01L 29/7786
USPC .......................................... 257/38, 105, 327
See application file for complete search history.

(56) References Cited

U.S. PATENT DOCUMENTS 4,799,090 A * 1/1989 Nishizawa .......... H01L 29/0843
257/106
6,110,783 A   8/2000 Burr
(Continued)

FOREIGN PATENT DOCUMENTS

| CN | 101447433 A | 6/2009 |
| CN | 102074583 A | 5/2011 |

(Continued)

OTHER PUBLICATIONS

Zhou et al., Vertical channel nMOSFET with an asymmetric graded lightly doped drain, Microelectronic Engineering (2005), 77(3-4):365-368.

*Primary Examiner* — David Chen
(74) *Attorney, Agent, or Firm* — Bret E. Field; Rudy J. Ng; Bozicevic, Field & Francis LLP

(57) ABSTRACT

The present invention discloses a short-gate tunneling field effect transistor having a non-uniformly doped vertical channel and a fabrication method thereof. The short-gate tunneling field effect transistor has a vertical channel and the channel region is doped in such a slowly-varied and non-uniform manner that a doping concentration in the channel region appears as a Gaussian distribution along a vertical direction and the doping concentration in the channel near the drain region is higher while the doping concentration in the channel near the source region is lower; and double control gates are formed at both sides of the vertical channel and the control gates form an L-shaped short-gate structure, so that a gate underlapped region is formed in the channel near the drain region, and a gate overlapped region is formed at the source region.

12 Claims, 3 Drawing Sheets

(51) Int. Cl.

| | |
|---|---|
| H01L 29/66 | (2006.01) |
| H01L 29/417 | (2006.01) |
| H01L 29/739 | (2006.01) |
| H01L 21/266 | (2006.01) |
| H01L 21/28 | (2006.01) |
| H01L 29/10 | (2006.01) |
| H01L 29/16 | (2006.01) |
| H01L 29/161 | (2006.01) |
| H01L 29/20 | (2006.01) |
| H01L 29/423 | (2006.01) |
| H01L 29/49 | (2006.01) |
| H01L 29/51 | (2006.01) |
| H01L 29/78 | (2006.01) |
| B82Y 10/00 | (2011.01) |
| H01L 29/40 | (2006.01) |
| H01L 29/41 | (2006.01) |

(52) U.S. Cl.
CPC ... *H01L21/28194* (2013.01); *H01L 21/28202* (2013.01); *H01L 29/0649* (2013.01); *H01L 29/0676* (2013.01); *H01L 29/0847* (2013.01); *H01L 29/1041* (2013.01); *H01L 29/16* (2013.01); *H01L 29/161* (2013.01); *H01L 29/20* (2013.01); *H01L 29/401* (2013.01); *H01L 29/413* (2013.01); *H01L 29/41775* (2013.01); *H01L 29/42376* (2013.01); *H01L 29/495* (2013.01); *H01L 29/4916* (2013.01); *H01L 29/51* (2013.01); *H01L 29/518* (2013.01); *H01L 29/66356* (2013.01); *H01L 29/66439* (2013.01); *H01L 29/66484* (2013.01); *H01L 29/66666* (2013.01); *H01L 29/7391* (2013.01); *H01L 29/7827* (2013.01); *H01L 29/7831* (2013.01)

(56) References Cited

U.S. PATENT DOCUMENTS

| | | | |
|---|---|---|---|
| 2003/0116792 A1* | 6/2003 | Chen et al. | B82Y 10/00 257/220 |
| 2005/0012111 A1 | 1/2005 | Howard et al. | |
| 2005/0127396 A1* | 6/2005 | Mitra et al. | H01L 29/16 257/145 |
| 2007/0045721 A1* | 3/2007 | Forbes | H01L 29/88 257/328 |
| 2007/0228491 A1* | 10/2007 | Forbes | H01L 29/0657 257/401 |
| 2008/0224224 A1* | 9/2008 | Vandenderghe et al. | B82Y 10/00 257/365 |
| 2010/0181614 A1* | 7/2010 | Nojima | H01L 29/7827 257/329 |
| 2010/0327319 A1* | 12/2010 | Iacopi et al. | H01L 29/7391 257/192 |
| 2011/0007578 A1* | 1/2011 | Okhonin et al. | G11C 11/39 365/189.09 |
| 2012/0113726 A1* | 5/2012 | Huang et al. | H01L 27/11556 365/185.27 |
| 2012/0187376 A1* | 7/2012 | Tomioka et al. | B82Y 10/00 257/24 |
| 2012/0261669 A1* | 10/2012 | Wang et al. | G02B 6/42 257/66 |
| 2013/0062673 A1* | 3/2013 | Masuoka et al. | H01L 27/14616 257/291 |
| 2013/0264544 A1* | 10/2013 | Karg et al. | B82Y 10/00 257/24 |

FOREIGN PATENT DOCUMENTS

| | | |
|---|---|---|
| CN | 102239563 A | 11/2011 |
| CN | 102664192 A | 9/2012 |
| CN | 103151391 A | 6/2013 |

* cited by examiner

SHORT-GATE TUNNELING FIELD EFFECT TRANSISTOR HAVING NON-UNIFORMLY DOPED VERTICAL CHANNEL AND FABRICATION METHOD THEREOF

FIELD OF THE INVENTION

The present invention relates to a field effect transistor logic device in CMOS ultra large scaled integrated (ULSI) circuits, and particularly relates to a short-gate tunneling field effect transistor having a non-uniformly doped vertical channel.

BACKGROUND OF THE INVENTION

Since the birth of the first integrated circuit, the technology of the integrated circuit has been developing following the Moore's law all the time. The semiconductor device has been sized down continuously. Meanwhile, because a sub-threshold slope of the conventional MOSFET cannot be decreased simultaneously with the shrink of the device due to the limitation of the thermoelectric force kT/q, a leakage current of the device increases, and thus the power consumption of the entire chip constantly rises, increasing the power consumption density of the chip sharply and thus severely blocking the chip from being applied to the system integration. In order to adapt to the developing trend of the integrated circuits, it is very important to research and develop a novel device having ultra-low power consumption. A tunneling field effect transistor (TFET) uses a new operation mechanism, namely, a band-to-band tunneling (BTBT), and has become a new and promising device for low power system integration application. The TFET modulates the energy band of the channel via its gate electrode, so that electrons in the valence band at the source terminal tunnel to the conduction band at the channel (or the electrons in the valence band at the channel tunnel to the conduction band at the source terminal) to form a tunneling current. Such a new operation mechanism breaks through the limitation of the thermoelectric potential kT/q in a sub-threshold slope theory limit of the conventional MOSFET, and can achieve an ultra steep sub-threshold slope lower than 60 mV/dec, reducing a static state leakage current of the device and thus reducing the static power consumption of the device.

However, an output characteristic of the TFET is entirely different from that of the conventional MOSFET. In the output characteristic of the conventional MOSFET, is achieved by an increase of a carrier mobility caused by the drain voltage. In the TFET, however, the increase of the output current with the increase of the drain voltage is achieved through the effective modulation of the tunneling width in the tunneling junction by the drain voltage, which is mainly dropped at the tunneling junction. Since there is an exponential relationship between the output tunneling current value and the tunneling width λ, the drain voltage and the output tunneling current exhibit a super-exponential relationship. Therefore, an unsaturation region in the fore-part of the output characteristic curve of the TFET becomes a nonlinear super exponential characteristic curve, that is, an output resistance of the transistor being applied to circuits is very large. Such an output characteristic of the TFET is detrimental to its application to circuits, and thus to improve the output characteristic of the TFET is an important issue in the application of the TFET to circuits.

SUMMARY OF THE INVENTION

The present invention aims to provide a short-gate tunneling field effect transistor having a non-uniformly doped vertical channel. By virtue of a structure of the transistor according to the present invention, the output characteristic of the tunneling field effect transistor can be dramaticlly improved.

The short-gate tunneling field effect transistor having the non-uniformly doped vertical channel according to the present invention is illustrated in FIG. 1. The tunneling field effect transistor includes a source region, a drain region, a channel region and a control gate. The tunneling field effect transistor is characterized in that it has a vertical channel and the channel region is doped in a slowly-varied and non-uniform manner. A doping concentration in the channel appears a Gaussian distribution along a vertical direction, and the doping concentration in the channel near the drain region is higher, which is generally higher than 1E14 $cm^{-3}$, while the doping concentration in the channel near the source region is lower, which is generally 2-3 orders of magnitude lower than the doping concentration in the channel near the drain region. In addition, double control gates are formed at both sides of the vertical channel and the control gates form an L-shaped short-gate structure. There is a gate overlapped region in the source region, and there is a gate underlapped region in the drain region of the channel. For an N-type transistor, the source region is heavily P-type doped (about 1E19 $cm^{-3}$-1E21 $cm^{-3}$) and the drain region is heavily N-type doped (about 1E19 $cm^{-3}$-1E21 $cm^{-3}$), and the channel region is P-type doped in a slowly-varied and non-uniform manner (a portion of the channel near the drain region has a higher doping concentration in a range of 1E14 $cm^{-3}$-1E17 $cm^{-3}$). For a P-type transistor, the source region is heavily N-type doped and the drain region is heavily P-type doped, and the channel region is N-type doped in a slowly-varied and non-uniform manner.

In the transistor, a length of the gate underlapped region in the drain region of the channel is associated with a length of the entire channel of the transistor. Since an excessively short length of the gate underlapped region cannot produce the effect of dramatically improving the output characteristic of the TFET, and an excessively long length of the gate underlapped region may weaken the gate control for the entire channel of the transistor and thus result in a degradation in the performance of the transistor, the length of the gate underlapped region is generally optimized as 50% or more of the length of the entire channel (i.e., the length between a edge of the source region and an edge of the drain region). The value may be in a range of 10 nm-5 um.

As to the relatively higher doping concentration in the vertical channel near the drain region in the vertical channel of the transistor, since an excessively low doping concentration cannot effectively shield the electrical field at the drain region, and an excessively high doping concentration may result in a P+-N+ junction formed at the drain region to occur a tunneling current at the drain region and to form a leakage current, the doping concentration in the channel near the drain region generally has a value in a range of 1E14 $cm^{-3}$-1E17 $cm^{-3}$.

The field effect transistor of the present invention has a vertical channel and a short-gate structure, and the channel is doped in a non-uniform manner. The field effect transistor of the present invention may be applied to the silicon-based semiconductor material or other semiconductor materials.

In order to achieve the above objects of the present invention, the present invention provides a corresponding fabrication method for achieving the non-uniformly doped vertical channel and the double-gate structure of the TFET, which particularly includes the following steps:

(1) preparing a substrate: a lightly doped or undoped semiconductor substrate;

(2) performing an initial thermal oxidation and depositing a nitride layer, and defining a pattern for the vertical channel by a photolithography process;

(3) forming the vertical channel by etching and exposing a source region, and implanting impurities into the source region;

(4) removing the nitride layer that was previously deposited and an oxide that was previously grown, and re-growing a gate dielectric layer and depositing a gate material layer;

(5) depositing a mask layer, a thickness of which is a length of the vertical short-gate of the transistor, and removing the remaining gate material layer to form an L-shaped double-gate structure;

(6) depositing a mask layer and performing ion implantation with a high energy and a low dosage (an implantation depth of impurities is deep but a concentration of the impurities is low) to form a non-uniform doping for the vertical channel, the relatively higher concentration near a drain region being about $1\times10^{14}$-$1\times10^{17}$ cm$^{-3}$;

(7) performing ion implantation with a low energy and a high dosage (an implantation depth of impurities is shallow but a concentration of the impurities is high) to implant impurities to the drain region, a doping concentration being about $1\times10^{19}$-$1\times10^{21}$ cm$^{-3}$;

(8) performing rapid high temperature annealing to activate the impurities;

(9) performing subsequent processes consistent with CMOS, including depositing a passivation layer, opening a contact hole and performing metallization and so on, so as to fabricate the short-gate tunneling field effect transistor having the non-uniformly doped vertical channel.

In the above fabrication method, in the step (1), a material of the semiconductor substrate is selected from Si, Ge, SiGe, GaAs or other binary or ternary compound semiconductor of Group II-VI, III-V, IV-IV, silicon on insulator (SOI) or germanium on insulator (GOI).

In the above fabrication method, in the step (4), a material of the gate dielectric layer is selected from $SiO_2$, $Si_3N_4$ or high-K gate dielectric material.

In the above fabrication method, in the step (4), a method for growing the gate dielectric layer is selected from one of the following methods: conventional thermal oxidation, nitrating thermal oxidation, chemical vapor deposition, and physical vapor deposition.

In the above fabrication method, in the step (4), a material of the gate material layer is selected from doped polysilicon, metal cobalt, nickel and other metal or metal silicide.

The technical effects of the present invention may include the followings (taking an N-type transistor as an example):

1. Owing to the vertical channel design of the transistor, a double-gate structure of the control gates is easily achieved in the process, and thus the gate control ability of the transistor is enhanced so that an on-current of the transistor is increased and a steeper sub-threshold slope is obtained.

2. Because of the non-uniform doping design of the channel, the doping concentration in the channel near the drain region is relatively higher, so that an electrical field at the drain region cannot penetrate through and reach the tunneling junction at the source region, and thus an impact of the drain voltage on the tunneling width of the tunneling junction at the source region is effectively reduced and the super exponential relationship between the output tunneling current and the drain voltage is weakened, and consequently the output resistance is reduced and the output characteristic of the transistor is improved.

3. Attributing to the short-gate design of the transistor, the gate underlapped region of the channel near the drain region forms a high resistance region, so that during an increase of the drain voltage, the drain voltage will mostly drop at the gate underlapped region, and thus the impact of the drain voltage on the tunneling width of the tunneling junction at the source region is effectively reduced, and in turn the output characteristic of the transistor is improved.

4. Since the transistor has a gate overlapped region in the source region, a tunneling perpendicular to a surface of the gate will occur in the gate overlapped source region, and thus a tunneling area is increased and the on-current of the transistor is increased.

5. By means of the L-shape structure of the control gates of the transistor, an intensity of the electrical field at corners of the control gates are large, which increases a tunneling electric field of the tunneling junction at the source region and thus it is beneficial to increase the on-current of the transistor and to gain a steeper sub-threshold slope.

Compared with the conventional TFET, the short-gate tunneling field effect transistor having the non-uniformly doped vertical channel, by virtue of the structure design of the transistor, can effectively suppress the impact of the electrical field at the drain region on the tunneling width of the tunneling junction at the source region; the super exponential relationship between the output tunneling current and the drain voltage is weakened; and the output characteristic of the transistor is improved. Meanwhile, the tunneling field effect transistor is beneficial to increase the on-current of the transistor and to gain a steeper sub-threshold slope.

In the figures, 1—a drain region; 2—a channel; 3a, 3b—a source region; 4, 4a, 4b—a polysilicon gate; 5, 5a, 5b—a gate oxide layer; 6—a metal electrode; 7—silicon nitride ($Si_3N_4$); 8—silicon dioxide ($SiO_2$).

DETAILED DESCRIPTION OF THE EMBODIMENTS

Hereinafter, the present invention will be described in detail in conjunction with embodiments. It should be noted that, embodiments are disclosed to help further understand the present invention. Those skilled in the art can appreciate that, various modifications and substitutions are possible without departing from the spirit and scope of the appended claims and the present invention. Therefore, the present invention should not be limited to the contents of the disclosed embodiments, and the scope of the present invention should be defined by the claims.

An implementation method for fabricating a short-gate tunneling field effect transistor having a non-uniformly doped vertical channel of the present invention will be further described below in detail by specific embodiments in conjunction with the attached drawings.

The specific implementation steps are shown in FIG. 2 to FIG. 6 (taking an N-type transistor as an example).

1. A $Si_3N_4$ film is deposited on a semiconductor substrate and a photolithography process is performed. A vertical channel region with a width of 20 nm-500 nm is formed by deeply etching through the RIE.

Figure 1:
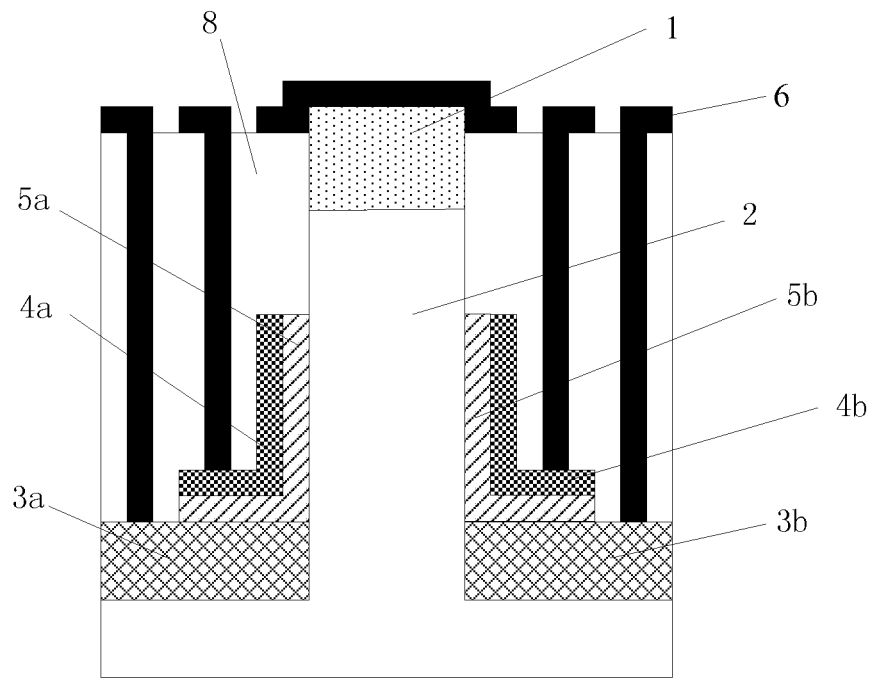
FIG. 1 is a schematic diagram showing a structure of a short-gate tunneling field effect transistor having a non-uniformly doped vertical channel according to the present invention.
Figure 2:
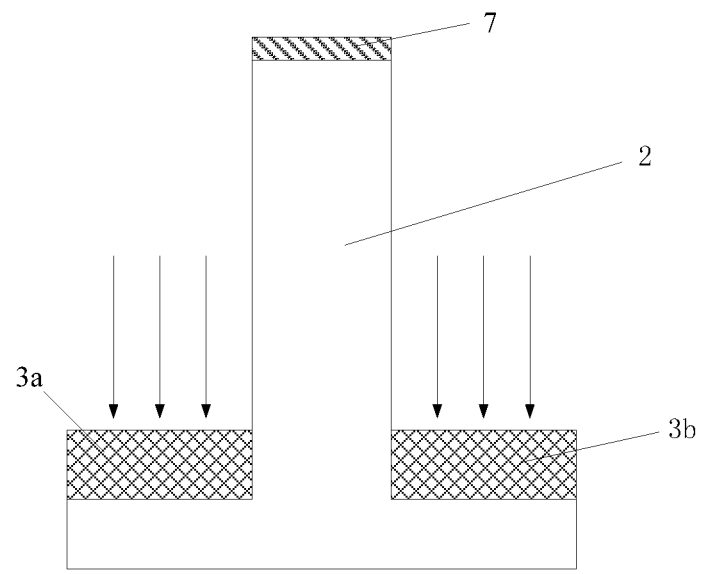
FIG. 2 shows a semiconductor substrate on which a vertical channel region is formed through etching and an implantation for a source region is performed.

2. After the etching, $BF_2$ ($10^{15}/cm^{-2}$, 20 keV) is implanted for a source region, as shown in FIG. 2, and the implanted impurities are activated (1050° C., 10 s).

Figure 3:
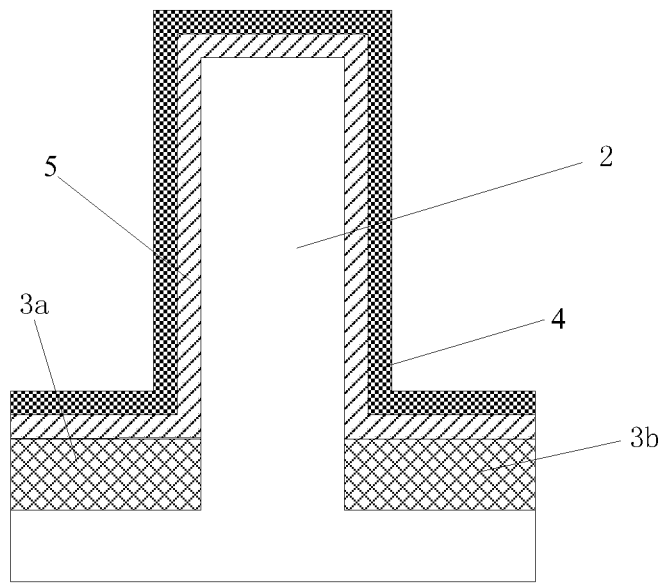
FIG. 3 is a schematic diagram showing a process of depositing a silicon dioxide layer and a polysilicon gate.

3. A gate oxide layer (5 nm) is formed through thermal oxidation, and a polysilicon gate (50 nm) is deposited by the LPCVD, as shown in FIG. 3.

Figure 4:
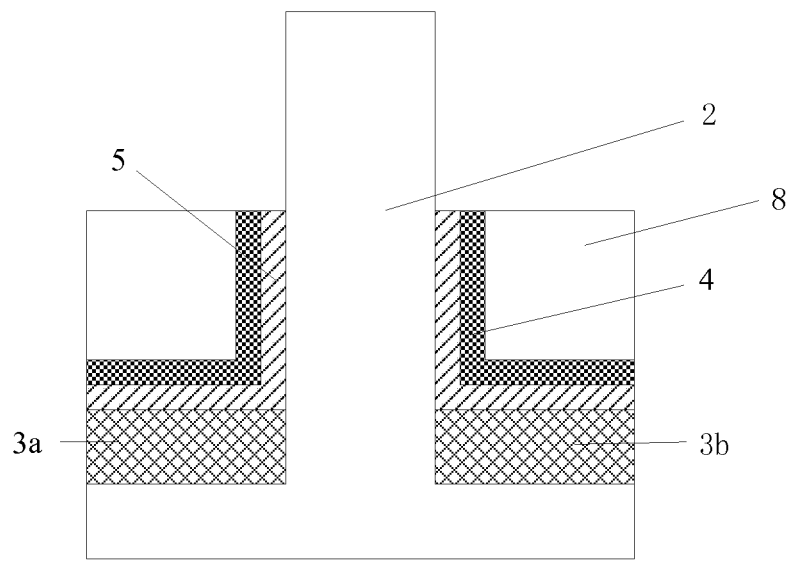
FIG. 4 is a schematic diagram showing a process of performing etching for the silicon dioxide layer and the polysilicon gate by isotropic back-etching to form a short-gate structure.

4. A silicon oxide layer is deposited. A thickness of the silicon oxide layer is a length of a vertical short gate of the transistor. The remaining portion of the polysilicon gate material is subjected to isotropic corrosion by using a dilute hydrofluoric acid (DHF), as shown in FIG. 4.

Figure 5:
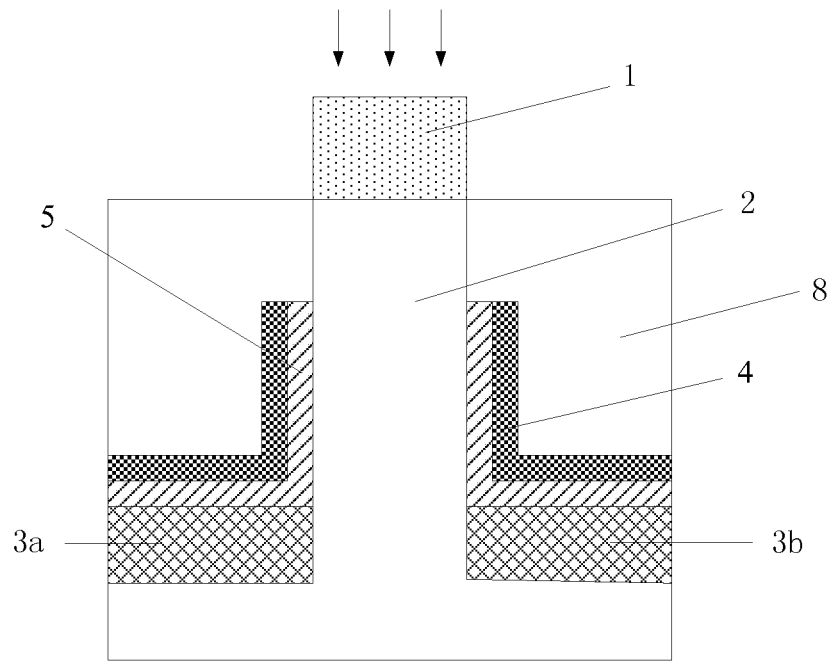
FIG. 5 is a schematic diagram showing a process of respectively performing a non-uniform doping implantation to the vertical channel and performing an impurity implantation to a drain region.

5. Firstly, an impurity implantation for the vertical channel region is performed by using $BF_2$ having a high energy and a low dosage ($10^{13}/cm^{-2}$, 50 keV), so that an impurity implantation depth in the channel region is relatively deep (passing through a drain region) and a concentration of the impurities is low. The vertical channel region is doped in a slowly-varied manner. Then, an impurity implantation is performed for the drain region by using a low energy and a high dosage (As, $10^{15}/cm^{-2}$, 10 keV), so that an impurity implantation depth is relatively shallow (stopping at the drain region) and a concentration of the impurities is high, as shown in FIG. 5.

Figure 6:
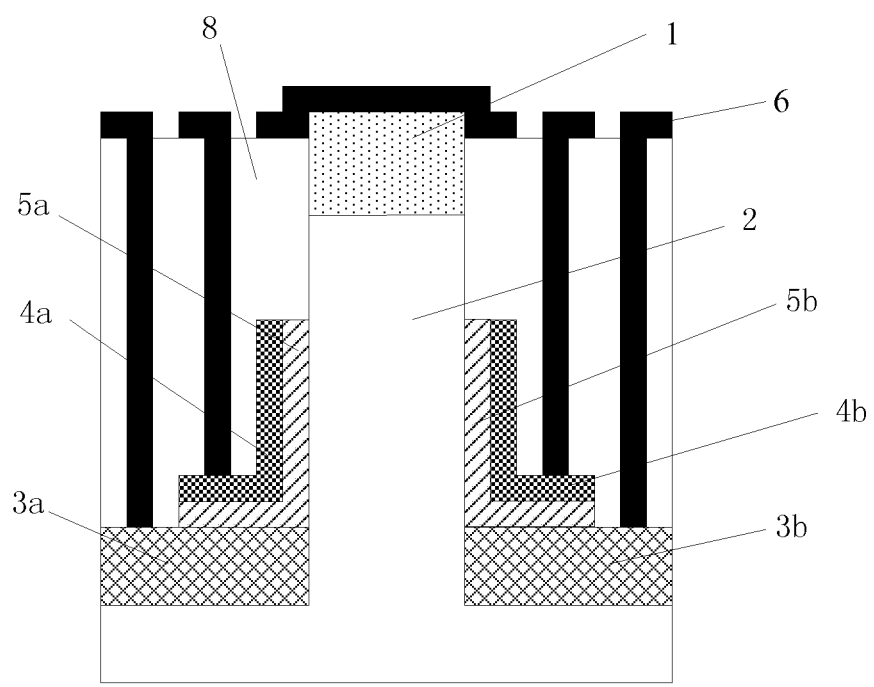
FIG. 6 is a schematic diagram showing a completely formed short-gate tunneling field effect transistor having a non-uniformly doped vertical channel.

6. Contact holes are formed through etching and metal electrodes are formed to form the short-gate tunneling field effect transistor having the non-uniformly doped vertical channel, as shown in FIG. 6.

While the present invention is disclosed by preferable embodiments, but they are not intended to limit the present invention. Many possible changes and modifications or equivalent embodiments may be made to the technical solutions of the present invention by those skilled in the art by using the above disclosed methods and technical contents, without departing from the scope of the technical solutions of the present invention. Therefore, any contents without departing from the technical solutions of the present invention and any modifications, equivalent changes and decorations made to the above embodiments according to the technical essence of the present invention fall into the scope of the technical solutions of the present invention.

What claimed is:

1. A short-gate tunneling field effect transistor comprising two source regions, a drain region, a vertical channel region and control gates, wherein the vertical channel region is doped in a non-uniform manner such that a doping concentration in the vertical channel region near the drain region is higher than a doping concentration in the vertical channel region near the source regions, wherein the source regions are located at both sides of the vertical channel region, and wherein the control gates are formed at both sides of the vertical channel region and the control gates form an L-shaped short-gate structure respectively, so that gate underlapped regions are formed in the vertical channel region near the drain region, and gate overlapped regions are formed at the source regions.

2. The short-gate tunneling field effect transistor of claim 1, wherein the doping concentration in the vertical channel region near the source regions is 2-3 orders of magnitude lower than the doping concentration in the vertical channel region near the drain region.

3. The short-gate tunneling field effect transistor of claim 1, wherein, for an N-type transistor, the source regions are heavily P-type doped and the drain region is heavily N-type doped, and the vertical channel region is P-type doped in the non-uniform manner; for a P-type transistor, the source regions are heavily N-type doped and the drain region is heavily P-type doped, and the vertical channel region is N-type doped in the non-uniform manner.

4. The short-gate tunneling field effect transistor of claim 1, wherein the doping concentration in the vertical channel region near the drain region has a value in a range of $1\times10^{14}$ $cm^{-3}$-$1\times10^{17}$ $cm^{-3}$.

5. The short-gate tunneling field effect transistor of claim 1, wherein the control gates comprise a material selected from doped polysilicon, metal cobalt, or nickel.

6. The short-gate tunneling field effect transistor of claim 1, wherein the source regions are implanted with impurities.

7. The short-gate tunneling field effect transistor of claim 6, wherein the impurities comprise $BF_2$.

8. A fabrication method of the short-gate tunneling field effect transistor of claim 1 having the non-uniformly doped vertical channel region, wherein the method comprises the following steps:
   (1) preparing a substrate: a lightly doped or undoped semiconductor substrate;
   (2) performing an initial thermal oxidation and depositing a nitride layer on the substrate, and defining a pattern for the vertical channel region by a photolithography process;
   (3) forming the vertical channel region by etching and exposing the source regions, and implanting impurities into the source regions;
   (4) removing the nitride layer that was previously deposited and an oxide that was previously grown, and re-growing a gate dielectric layer and depositing a gate material layer;
   (5) depositing a mask layer, a thickness of which is a length of a vertical short-gate of the transistor, and removing the gate material layer not covered by the mask layer to form the L-shaped short-gate structure;
   (6) depositing another mask layer and performing ion implantation with a high energy and a low dosage to form the non-uniform doping for the vertical channel region, the doping concentration near the drain region being $1\times10^{14}$-$1\times10^{17}$ $cm^{-3}$;
   (7) performing ion implantation with a low energy and a high dosage to implant impurities to the drain region, a doping concentration being $1\times10^{19}$-$1\times10^{21}$ $cm^{-3}$;
   (8) performing rapid high temperature annealing to activate the impurities; and
   (9) depositing a passivation layer, opening a contact hole and performing metallization.

9. The fabrication method of claim 8, wherein, in the step (1), a material of the semiconductor substrate is selected from Si, Ge, SiGe, GaAs or other binary or ternary compound semiconductors of Group II-VI, III-V, IV-IV, silicon on insulator or germanium on insulator.

10. The fabrication method of claim 8, wherein, in the step (4), a material of the gate dielectric layer is selected from $SiO_2$ or $Si_3N_4$.

11. The fabrication method of claim 8, wherein, in the step (4), a method for re-growing the gate dielectric layer is selected from one of the following methods: conventional thermal oxidation, nitrating thermal oxidation, chemical vapor deposition, and physical vapor deposition.

12. The fabrication method of claim 8, wherein, in the step 4), a material of the gate material layer is selected from doped polysilicon, metal cobalt, or nickel.

* * * * *